(12) United States Patent
Conrad et al.

(10) Patent No.: US 8,570,637 B2
(45) Date of Patent: Oct. 29, 2013

(54) MICROMECHANICAL ELEMENT

(75) Inventors: Holger Conrad, Dresden (DE); Denis Jung, Dresden (DE)

(73) Assignee: Fraunhofer-Gesellschaft Foerderung der Angewandten Forschung E.V., Munich (DE)

(*) Notice: Subject to any disclaimer, the term of this patent is extended or adjusted under 35 U.S.C. 154(b) by 102 days.

(21) Appl. No.: 13/091,571

(22) Filed: Apr. 21, 2011

(65) Prior Publication Data

US 2011/0261431 A1    Oct. 27, 2011

(30) Foreign Application Priority Data

Apr. 22, 2010 (DE) .......................... 10 2010 028 111

(51) Int. Cl.
*G02B 26/00* (2006.01)

(52) U.S. Cl.
USPC .......................... 359/290; 359/390; 359/199.4

(58) Field of Classification Search
USPC .............................. 359/290–291, 197.1–199.4
See application file for complete search history.

(56) References Cited

U.S. PATENT DOCUMENTS

| | | | |
|---|---|---|---|
| 3,904,274 A | 9/1975 | Feinleib | |
| 4,128,309 A | 12/1978 | Lehureau | |
| 4,298,247 A | 11/1981 | Michelet | |
| 4,420,222 A | 12/1983 | Bret | |
| 5,710,657 A | 1/1998 | Um | |
| 6,053,409 A | 4/2000 | Brobst | |
| 6,300,665 B1* | 10/2001 | Peeters et al. | 257/415 |
| 6,337,760 B1* | 1/2002 | Huibers et al. | 359/291 |
| 6,603,894 B1* | 8/2003 | Pu | 385/18 |
| 6,822,797 B1* | 11/2004 | Carlisle et al. | 359/572 |
| 7,369,288 B2 | 5/2008 | Wolter | |
| 2002/0135857 A1 | 9/2002 | Fitzpatrick | |

(Continued)

FOREIGN PATENT DOCUMENTS

| | | |
|---|---|---|
| DE | 2816192 | 10/1979 |
| DE | 19857946 | 1/2000 |

(Continued)

OTHER PUBLICATIONS

Shao et al., "3-D MOEMS Mirror for Laser Beam Pointing and Focus Control," *IEEE Journal of Selected Topics in Quantum Electronics*, vol. 10, No. 3, May/Jun. 2004, pp. 528-535.

(Continued)

*Primary Examiner* — Thomas K Pham
*Assistant Examiner* — Vipin Patel
(74) *Attorney, Agent, or Firm* — Patterson Thuente Pedersen, P.A.

(57) ABSTRACT

A micromechanical element includes a plate-shaped micromechanical functional element, an inner frame and an outer frame. Thereby, a curvature of a main face of the plate-shaped micromechanical functional element is variable. The inner frame encloses the plate-shaped micromechanical functional element along an edge of the main face and is connected to the plate-shaped micromechanical functional element via a plurality of connecting pieces. The outer frame is connected to the inner frame via at least two holding elements. The inner frame is connected to the plate-shaped micromechanical functional element and the outer frame, such that a first angle between the main face of the plate-shaped micromechanical functional element and a main face of the inner frame is smaller than a second angle between a main face of the outer frame and the main face of the inner frame, when the main face of the plate-shaped micromechanical functional element is in a bent state.

27 Claims, 10 Drawing Sheets

(56) References Cited

U.S. PATENT DOCUMENTS

| | | |
|---|---|---|
| 2004/0125472 A1 | 7/2004 | Belt |
| 2004/0233553 A1 | 11/2004 | Shibata |
| 2005/0122856 A1 | 6/2005 | Nagashima |
| 2006/0232846 A1 | 10/2006 | Himmer |
| 2007/0097134 A1* | 5/2007 | Miles .......................... 345/540 |
| 2010/0277783 A1 | 11/2010 | Takahashi |

FOREIGN PATENT DOCUMENTS

| | | |
|---|---|---|
| DE | 19917519 | 11/2000 |
| DE | 102008049647 | 4/2010 |
| EP | 0743541 | 11/1996 |
| JP | 2004070004 | 3/2004 |
| WO | WO 2009087883 A1 | 7/2009 |

OTHER PUBLICATIONS

Mescheder et al., "Distortion Optimized Focusing Mirror Device with Large Aperture," *Institute of Applied Research, University of Applied Sciences*, © 2005, available online at www.sciencedirect.com, pp. 20-27.

Conrad et al., "Actuating Methods of Quasistatic Micromirrors for Active Focus Variation," *International Students and Young Scientists Workshop, Photonics and Microsystems*, © 2008 IEEE, 5 pages.

German Office Action, Application No. DE102010028111.5, dated Jul. 27, 2011, 4 pages.

S.J. Lakes et al.: "Surface micro-machine SU-8 2002 deformable mirrors for focus control"; MOEMS and Miniaturized Systems IX, edited by Harald Schenk, Wibool Piyawattanametha, Proc. of SPIE vol. 7594, Feb. 2010, 75940E-1-6.

* cited by examiner

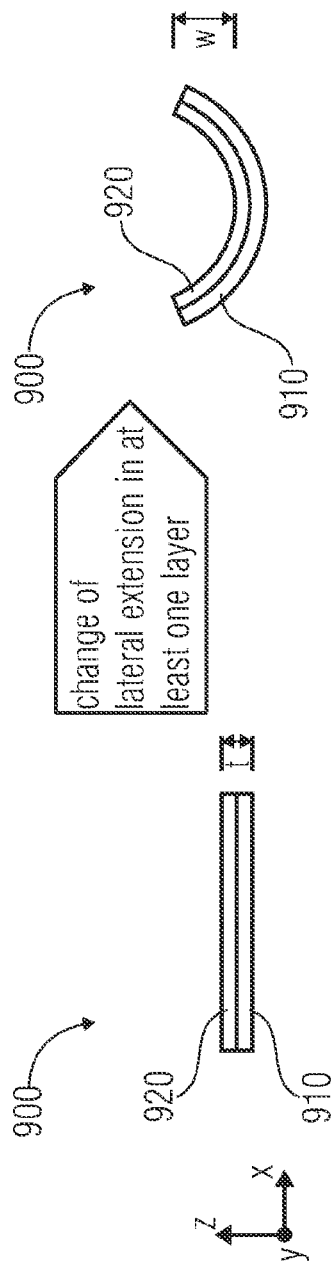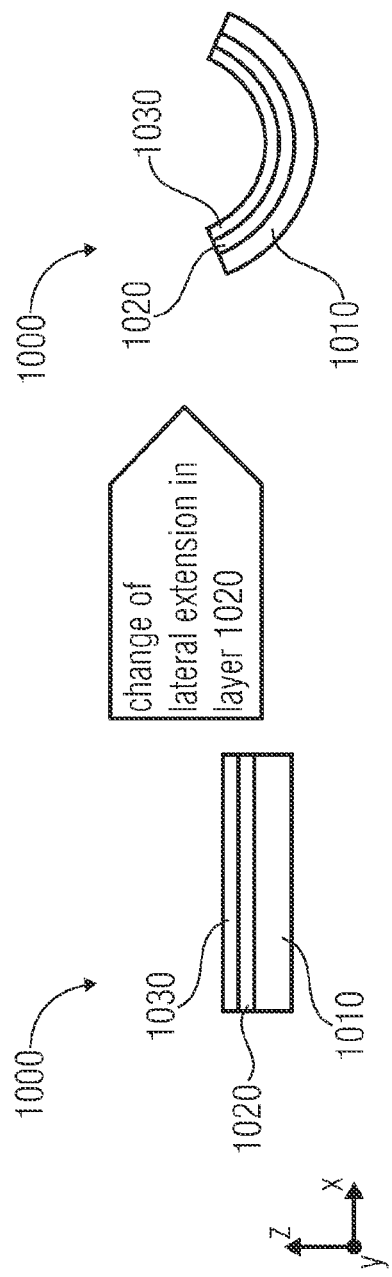

MICROMECHANICAL ELEMENT

CROSS-REFERENCE TO RELATED APPLICATIONS

This application claims priority from German Patent Application No. 102010028111.5-54, which was filed on Apr. 22, 2010, and is incorporated herein in its entirety by reference.

BACKGROUND OF THE INVENTION

Embodiments according to the invention relate to a micromechanical element and a method for producing a micromechanical element.

A series of different micromirrors are known. For example, micromechanically produced mirrors for active focus variation bendable in a convex and/or concave manner are known. A very simplified illustration (cross-section) of a mirror deflectable according to the bimorph principle is shown, for example, in FIGS. 9a and 9b. Here, the mirror plate 900 consists of at least two layers 910 and 920 of different materials.

In order to be able to actively bend the mirror plate, a lateral mechanical expansion $\epsilon_x$ and $\epsilon_y$ has to be actively adjustable in at least one layer. The actively adjustable expansion can be generated, for example, with the help of thermal excitation (thermomechanical bimorph/for example with electrothermal heating), wherein the materials of both layers 910 and 920 have different coefficients of linear expansion, piezoelectric and electrostrictive excitation (electroactive monomorphs, bimorphs and multimorphs using the transversal effect) and piezomagnetic and magnetostrictive excitation (magnetoactive mono, bi and multimorphs using the transversal effect). In the cases of electroactive excitation via transversal effects in electroactive (piezoelectric and electrostrictive) solids, the mirror plate has to consist of at least three different layers (two electrodes and an electroactive layer arranged outside the line of zero expansion ("neutral fiber")).

An exemplary arrangement of an electroactive monomorph 1000 (frequently also referred to as unimorph) is shown in FIGS. 10a and 10b. Here, the electroactive layer 1020 is arranged between two electrode layers 1010 and 1030. If an electric voltage is applied between both electrode layers, an electric field $E_z$ will be created within the electroactive layer. Due to the existence of the electric field and the transversal effects, a lateral expansion $\epsilon_x$ and $\epsilon_y$ will generated within the electroactive layer 1020. In the case of piezoelectric materials, this mechanical expansion depends directly, and in the case of electrostrictive materials in a square-law manner, on the electric field strength and results in a bending of the mirror plate 1000.

For further possible layer arrangements of such devices, for example, two active materials are used in bimorphs, or multiple layer stacks in multimorphs connected in parallel with the aim of reducing the necessitated electric drive voltage.

Generally, parabolic surface profiles (rotation paraboloides) are suitable for focusing light with the help of mirrors. If a plate is bent due to lateral expansion (by the above shown monomorph and bimorph arrangements), a spherical surface profile (hemisphere) results at "small" deflections. In "Conrad, H., Klose, T., Sander, T., Schenk, H., Lakner, H.: Actuating Methods of Quasistatic Micromirrors for Active Focus Variation. Proc. of the IEEE 2008 International Students and Young Scientists Workshop "Photonics and Microsystems", pp. 7-11, 2008" it has been shown based on simple calculations, that depending on the lateral dimensions (diameter) of the mirror plate, the deviation between spherical and parabolic surface profile is negligibly small up to a focus length of approximately 3 cm. Hence, spherically bent mirror plates are also suitable for focusing light.

Further mircomirrors exist for active focus variation, which are deflected with the help of the electrostatic drive principle (e.g., "Shao, Y., Dickensheets, D.-L., Himmer, P.: 3-D MOEMS Mirror for Laser Beam Pointing and Focus Control. IEEE Journal of Selected Topics in Quantum Electronics, Vol. 10, No. 3, pp. 528-535, 2004" and "Mescheder, U. M., Estan, C., Somogyi, G. Freudenreich, M.: Distortion optimized focusing mirror device with large aperture. Sensors and Actuators A, 130-131, pp. 20-27, 2006"). Compared to the bimorph and monomorph deflectable mirrors, micromirrors necessitate higher electric drive voltages ("Conrad, H., Klose, T., Sander, T., Schenk, H., Lakner, H.: Actuating Methods of Quasistatic Micromirrors for Active Focus Variation. Proc. of the IEEE 2008 International Students and Young Scientists Workshop "Photonics and Microsystems", pp. 7-11, 20"). In these micromirrors, the curvature variation is caused by a force (of the electrostatic field) vertically active at the mirror plate. Such electrostatically driven systems are to be distinguished from electrostatically actively bendable systems as mentioned above.

Generally, due to technological limitations in the production of such a micro system (release of the mirror plate) and for better resistance against mechanical environmental influences (shock resistance), the mirror plate can be connected at its edge to a fixed frame via spring elements. FIG. 11 shows an example of such a micromirror 1100 (black: open, etched trenches). Here, this actively bendable mirror plate 1110 is fixed at the frame 1130 of the device 1100 via four spring elements 1132.

This results in deformation errors by restoring forces of the suspension of the mirror plate 1110. The spring elements 1132 are designed such that they counteract the movement of edges 1112 and 1114 of the mirror plate with mechanical restoring forces that are as small as possible. Here, the spring elements are strained both with regard to bending and torsion. For the mirror plate to be able to bend due to the actively coupled lateral expansion, the edge of the mirror plate has to be freely moving to the greatest possible extent.

The edge of the mirror plate moves laterally (the mirror plate contracts or expands) and the edge of the mirror plate is tilted.

Since the mirror plate is connected to the fixed frame 1130 at discrete attachment positions 1112 at the plate edge via spring elements 1132, and the spring elements cannot be implemented infinitely soft (due to the shock resistance and manufacturability of the device), the mirror plate experiences less spherical bending in the direction of the attachment position 1112 and more spherical bending in the direction of the free plate edge 1114.

Hence, a non-rotation symmetrical deformation profile results in the circular mirror plate 1110. The deviation (error) to the spherical or parabolic deformation profile is positive in the direction of the free plate edge and negative in the direction of the spring elements. The amount of deviation from the ideal deformation profile depends on the lateral size of the mirror plate (e.g. diameter d in a circular plate), occurs already at small deflections and results in a significant decrease of the optical quality of the focusing mirror.

Additionally, non-linear deformation errors in large deflections can occur. The above-mentioned purely spherical deformation profile caused by lateral expansion of a layer within a plate applies only for "small" deflections. The deflection is small when the bending w is smaller than the whole plate thickness t (w and t see FIG. 9). For larger deflections, the linear plate theory (so-called Kirchhoff's Plate Theory) does no longer apply. The higher the ratio of bending to the overall plate thickness (w/t), the more the plate assumes diaphragm-like behavior, which is characterized by little to no bending strength. This results in "fold-like" surface profiles or fold-like deviations from the ideal deformation profile. These fold-like deviations from the ideal deformation profile occur within the whole mirror plate and result in a significant decrease of the optical quality at large deflections (curvatures) of the focus mirror.

Theoretically, it would be possible to minimize this non-linear error by a thick mirror plate (t is higher than the bending w maximally necessitated for the target application). However, producing thick mirror plates with the help of microsystem technology is very expensive (reason: depositing and structuring of thick layers) and the bending moment to be overcome is non-linearly dependent on the plate thickness (bending moment~plate thickness$^3$), significantly higher driving forces in the form of higher actively coupled lateral expansions (which have to be generated by higher electric voltages, for example in the case of electroactive functional layers) are necessitated for bending thick plates.

SUMMARY

According to an embodiment, a micromechanical element can have: a plate-shaped micromechanical functional element, wherein a curvature of a main face of the plate-shaped micromechanical functional element is variable, an inner frame that encloses the plate-shaped micromechanical functional element along an edge of the main face of the plate-shaped micromechanical functional element and that is connected to the plate-shaped micromechanical functional element via a plurality of connecting pieces; and an outer frame connected to the inner frame via at least two holding elements, wherein the inner frame is connected to the plate-shaped micromechanical functional element and the outer frame such that an amount of a first angle between the main face of the plate-shaped micromechanical functional element at the edge of the plate-shaped micromechanical functional element and a main face of the inner frame at an edge of the inner frame facing the plate-shaped micromechanical functional element is smaller than an amount of a second angle between a main face of the outer frame and the main face of the inner frame at an edge of the inner frame facing the outer frame, when the main face of the plate-shaped micromechanical functional element is in a bent state.

According to another embodiment, a micromechanical element can have: a plate-shaped micromechanical functional element with a first part and a second part, wherein the first part of the plate-shaped micromechanical functional element encloses the first part of the plate-shaped micromechanical functional element along an edge of the first part and is connected to the first part via a plurality of connecting pieces, wherein the first part and the second part form a main face of the plate-shaped micromechanical functional element, and wherein a curvature of the main face of the plate-shaped micromechanical functional element is variable by varying a curvature of the first part of the plate-shaped micromechanical functional element and a curvature of the second part of the plate-shaped micromechanical functional element; and an outer frame connected to the plate-shaped micromechanical functional element via at least two holding elements.

According to another embodiment, a method for producing an inventive micromechanical element can include: etching open trenches to determine a shape of the micromechanical element.

One embodiment provides a micromechanical element. The micromechanical element comprises a plate-shaped micromechanical functional element, an inner frame and an outer frame. Thereby, the plate-shaped micromechanical functional element is implemented such that a curvature of a main face of the plate-shaped micromechanical functional element can be varied. The inner frame encloses the plate-shaped micromechanical functional element along an edge of the main face of the plate-shaped micromechanical functional element and is connected to the plate-shaped micromechanical functional element via a plurality of connecting pieces. The outer frame is connected to the inner frame via at least two holding elements. Thereby, the inner frame is connected to the plate-shaped micromechanical functional element and the outer frame such that an amount of a first angle between the main face of the plate-shaped micromechanical functional element at the edge of the plate-shaped micromechanical functional element and a main face of the inner frame at an edge of the inner frame facing the plate-shaped micromechanical functional element is smaller than an amount of a second angle between a main face of the outer frame and the main face of the inner frame at an edge of the inner frame facing the outer frame, when the main face of the plate-shaped micromechanical functional element is in a bent state.

A further embodiment provides a micromechanical element having a plate-shaped micromechanical functional element with a first part and a second part and an outer frame. The second part of the plate-shaped micromechanical functional element encloses the first part of the plate-shaped micromechanical functional element along an edge of the first part and is connected to the first part via a plurality of connecting pieces. The first part and the second part form a main face of the plate-shaped micromechanical functional element. The plate-shaped micromechanical functional element is implemented such that a curvature of the main face of the plate-shaped micromechanical functional element is variable by varying a curvature of the first part of the plate-shaped micromechanical functional element and a curvature of the second part of the plate-shaped micromechanical functional element. Further, the outer frame is connected to the plate-shaped micromechanical functional element via at least two holding elements.

Embodiments are based on the central idea that deviations of the deformation profile of the main face of a micromechanical functional element can be reduced by integrating an inner frame or by partitioning the bendable main face into several parts. By using an inner frame, the deviations of the deformation profile of the main face from the ideal deformation profile resulting from the restoring forces of the holding elements can be significantly reduced. Thereby, for example, more rigid holding elements can be used, which can have a positive effect on the resistance against mechanical interference effects.

In the same way, by partitioning the plate-shaped micromechanical functional element, a deviation from the ideal deformation profile can be significantly reduced. In particular, thereby, the deviation from the ideal deformation profile can also be reduced at large deflections (strong curvature) of the main face of the plate-shaped micromechanical functional element, even when the bending is higher than the overall thickness of the plate-shaped micromechanical functional element. Thus, even thin plate-shaped micromechanical functional elements can be used, whereby power consumption or electric drive voltages for realizing the variable bending of the main face of the plate-shaped micromechanical functional element can be reduced. Additionally, manufacturing the micromechanical element is possible without extra effort, since etching open trenches for structuring the plate-shaped micromechanical functional element is necessitated anyway.

Several embodiments relate to a micromechanical element having both an inner frame and a partitioning of the plate-shaped micromechanical functional element into several parts.

In several embodiments, the plate-shaped micromechanical functional element of the micromechanical element has a layer with an extension laterally variable with respect to the main face, for varying a curvature of the main face of the plate-shaped micromechanical functional element based on the controllable excitation.

Several further embodiments relate to a micromechanical element where the plate-shaped micromechanical functional element can be actively bent based on the thermomechanical, piezoelectric, electrostrictive, piezomagnetic or magnetostrictive effect.

BRIEF DESCRIPTION OF THE DRAWINGS

Embodiments of the present invention will be detailed subsequently referring to the appended drawings, in which:

FIG. 9a, 9b is a schematic cross-section of a planar (non-deflected) and a bent mirror plate consisting of two different layers;

FIG. 10a, 10b is a schematic cross-section of a planar (non-deflected) and a bent mirror plate consisting of three different layers (electroactive excitation)

DETAILED DESCRIPTION

In the following, partly, the same reference numbers are used for objects and functional units having the same or similar functional characteristics. Further, optional features of the different embodiments can be combined or exchanged with one another.

Figure 1A:
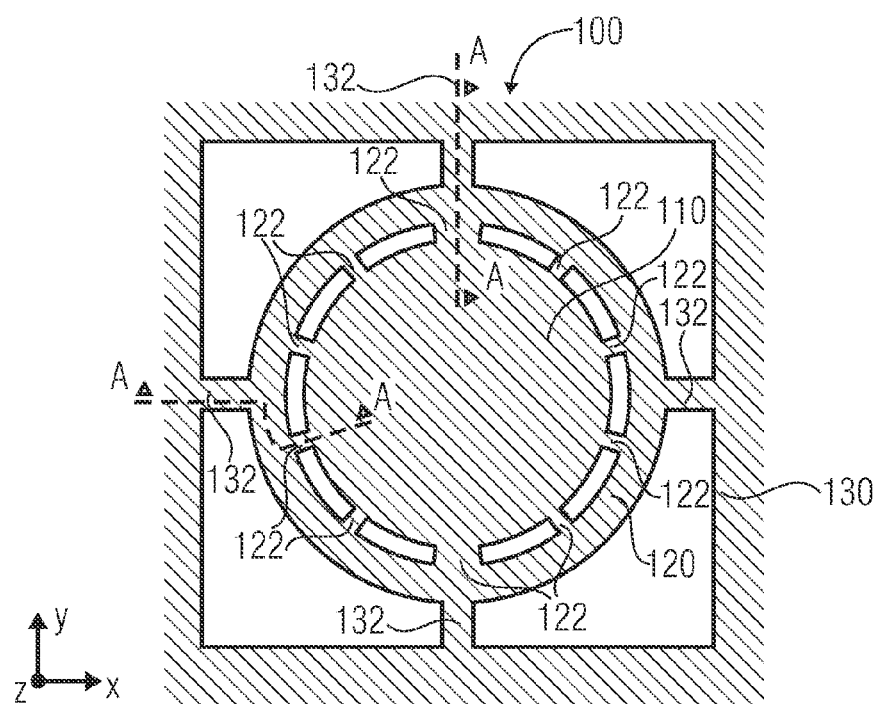
FIG. 1a, 1b is a schematic illustration of a top view of a micromechanical element.
Figure 1B:
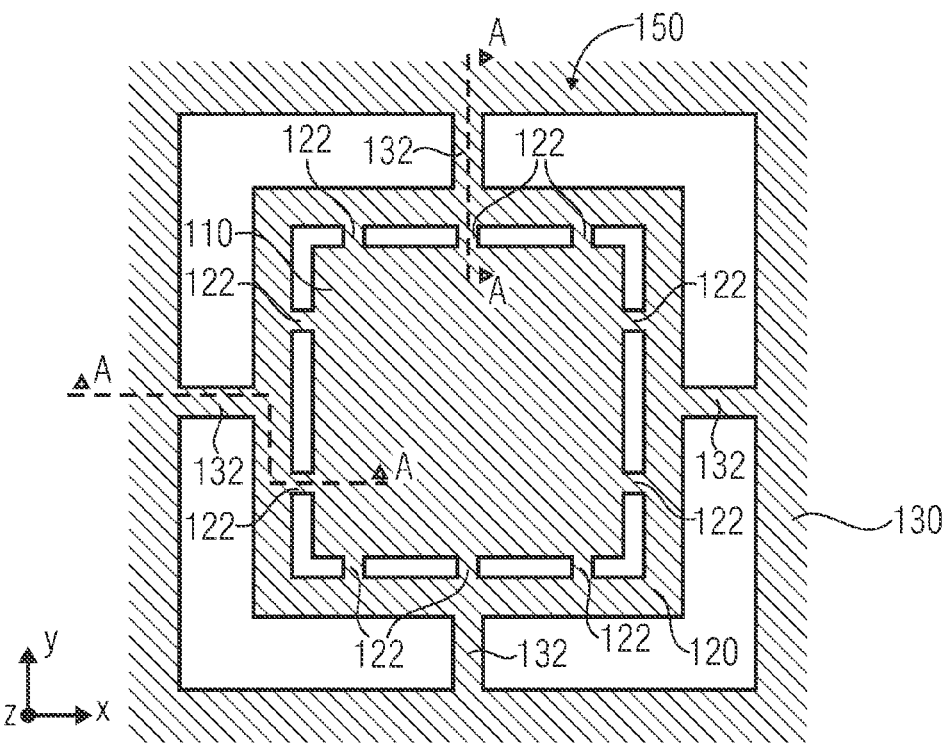

FIGS. 1a and 1b show a schematic illustration of a micromechanical element 100, 150 according to an embodiment of the invention. The micromechanical element 100, 150 comprises a plate-shaped micromechanical functional element 110, an inner frame 120 and an outer frame 130. The plate-shaped micromechanical functional element 110 is implemented such that a curvature of the main face of the plate-shaped micromechanical functional element 110 can be varied. The inner frame 120 encloses the plate-shaped micromechanical functional element 110 along an edge of the main face of the plate-shaped micromechanical functional element 110 and is connected to the plate-shaped micromechanical functional element 110 via a plurality of connecting pieces 122. The outer frame 130 is connected to the inner frame 120 via at least two holding elements 132. Further, the inner frame 120 is connected to the plate-shaped micromechanical functional element 110 and the outer frame 130, such that an amount of a first angle between the main face of the plate-shaped micromechanical functional element 110 at the edge of the plate-shaped micromechanical functional element 110 and a main face of the inner frame 120 at an edge of the inner frame 120 facing the plate-shaped micromechanical functional element is smaller than an amount of a second angle between a main face of the outer frame 130 and the main face of the inner frame 120 at an edge of the inner frame 120 facing the outer frame 130, when the main face of the plate-shaped micromechanical functional element 110 is in a bent state.

By using the inner frame 120, an influence of the restoring force of the holding elements in a bending of the plate-shaped micromechanical functional element 110 on the deformation profile of the main face can be reduced significantly. This can be ensured by connecting the inner frame 120 with the plate-shaped micromechanical functional element 110 and the outer frame such that the first angle is smaller than the second angle when the main face of the plate-shaped micromechanical functional element 110 is bent.

Figure 2A:
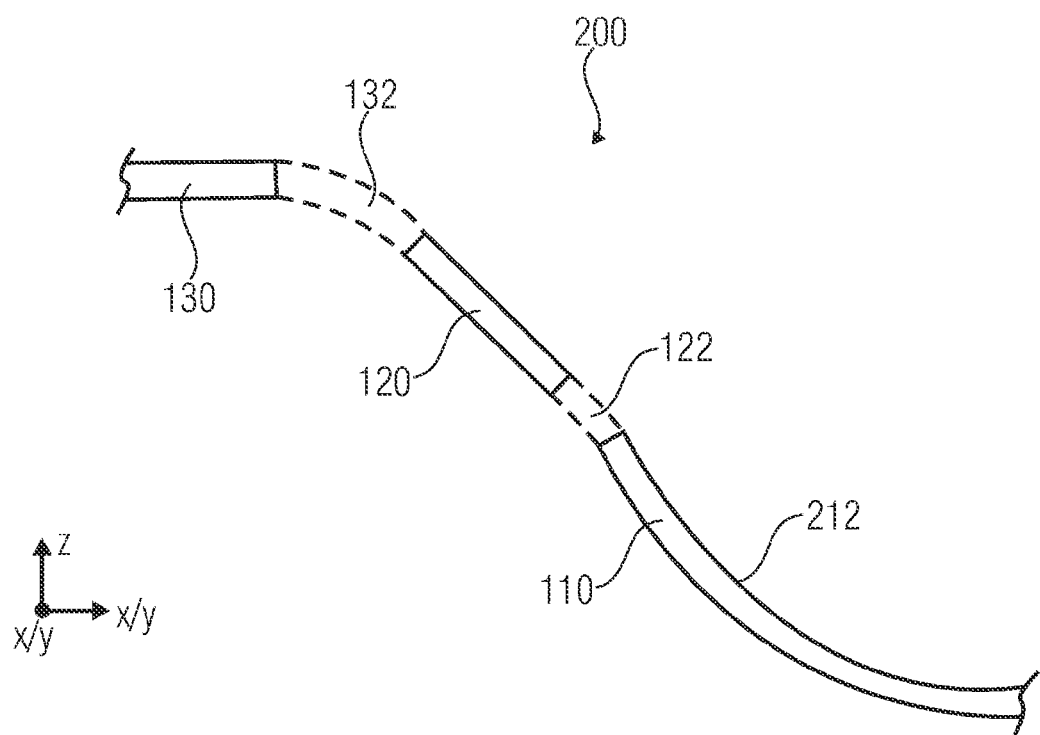
FIG. 2a, 2b is a schematic illustration of a cross-section of a micromechanical element.
Figure 2B:
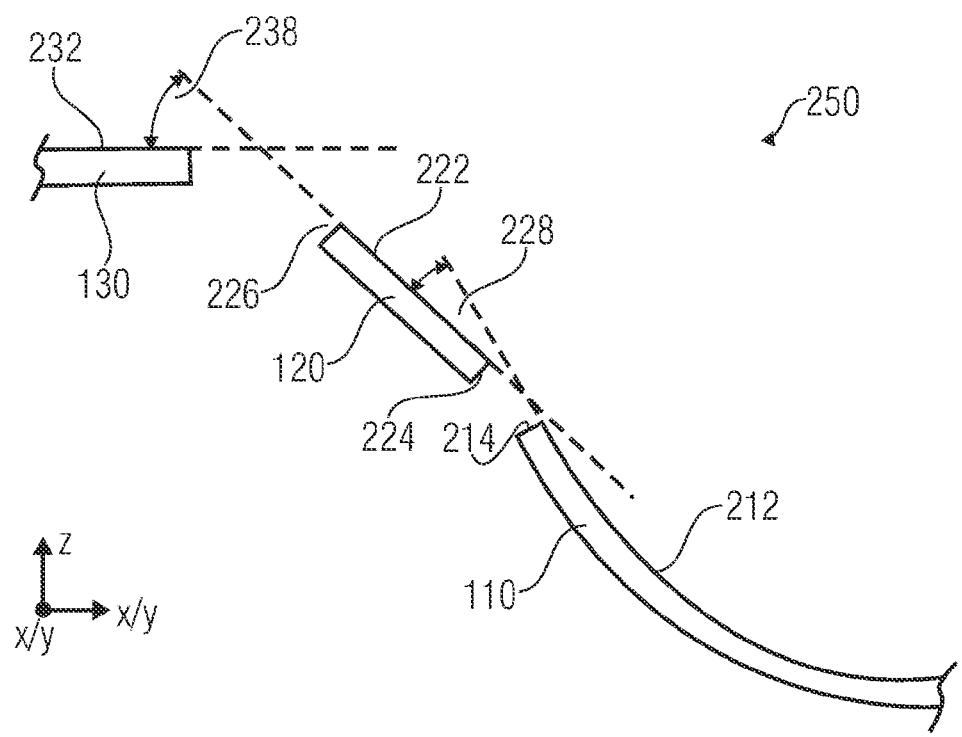

For illustrating the angle ratios, FIGS. 2a and 2b show a schematic illustration of a cross-section of a micromechanical element along intersection lines A-A shown in FIG. 1a or 1b.

FIG. 2a shows the micromechanical element 200 from the outer frame 130 via a holding element 132, the inner frame 120 and a connecting piece 122 to the plate-shaped micromechanical functional element 110 with bent main face 212. Thereby, for illustrating the different parts (outer frame, holding element, inner frame, connecting piece, plate-shaped micromechanical functional element) of the micromechanical element 200 more clearly, the holding element 132 and the connecting piece 122 are illustrated in dotted lines, although the outer frame 130, the holding element 132, the inner frame 120, the connecting piece 122 and the plate-shaped micromechanical functional element 110 can also have a continuous homogenous material layer (can be produced, for example, based on a common silicon layer). In correspondence to the cross-sectional illustration shown in FIG. 2a, FIG. 2b shows the angle ratios between outer frame 130, inner frame 120 and plate-shaped micromechanical functional element 110. The holding element 132 and the connecting piece 122 have not been illustrated for clarifying the angle ratios. As shown, the first angle 228 is defined between the main face 212 of the plate-shaped micromechanical functional element 110 at the edge 214 of the plate-shaped micromechanical functional element 110 and a main face 222 of the inner frame 120 at an edge 224 of the inner frame 120 facing the plate-shaped micromechanical functional element 110. The second angle 238 is defined between a main face 232 of the outer frame 130 and the main face 222 of the inner frame 120 at an edge 226 of the inner frame 120 facing the outer frame 130. As illustrated, the amount of the first angle 228 is smaller than the amount of the second angle 238, when the main face 212 is in a bent state. This does not only apply when the plate-shaped micromechanical functional element 110 is bent in a bowl-shape (towards the bottom) but also when it is bent in a helmet-shape (towards the top). The angle ratio relates to a bent state of the plate-shaped micromechanical functional element 110, since the plate-shaped micromechanical functional element 110 can be planar (without curvature) in a resting state or also in an operating state.

These angle ratios can be determined, for example, very easily in a cross-section of the micromechanical element, whose sectional plane is orthogonal to the main face 212 of the plate-shaped micromechanical functional element 110 in a center or center of gravity of the plate-shaped micromechanical functional element 110.

The ratio of first angle 228 to second angle 238 depends, for example, on the restoring force that the connecting pieces have on the plate-shaped micromechanical functional element 110, and the restoring force that the holding elements 132 have on the inner frame 120. By specifically selecting the shape of the inner frame 120, the shape and number of holding elements 132 and the shape and number of connecting pieces 122, it can be achieved that the first angle 228 is smaller than the second angle 238 when the plate-shaped micromechanical functional element 110 is in a bent state. This angle ratio results, for example, when the inner frame 120 is connected more rigidly to the plate-shaped micromechanical functional element 110 than to the outer frame 130. The first angle 128 can also be zero or almost zero when the main face of the plate-shaped micromechanical functional element 110 is only slightly bent. This can be obtained, for example, by a number of connecting pieces 122 that is higher than the number of holding elements 132. For example, more than twice, four times or ten times as many connecting pieces 122 as holding elements 132 can exist. Thereby, instead of several large restoring forces, many smaller restoring forces act on the plate-shaped micromechanical functional element 110, which can enable a reduction of the deviation from the ideal deformation profile of the main face of plate-shaped micromechanical functional element 110. A symmetrical arrangement of the connecting pieces around the periphery of the plate-shaped micromechanical functional element 110 can contribute to making the first angle 228 significantly smaller than the second angle 238. The shape of the inner frame 120, the shape and number of connecting pieces 122 as well as the shape and the number of holding elements 138 can be optimized by simulation, such that the first angle 228 becomes as small as possible in relation to the second angle 238, whereby a deviation from the ideal deformation profile can be minimized.

The plate-shaped micromechanical functional element 110 can, for example, have a round, elliptic, square, rectangular or polygonal shape or a polygon-like free form. In this context, the term plate-shaped of the plate-shaped micromechanical functional element 110 means only that the functional element has a significantly higher extension in two dimensions compared to its third dimension. For example, in two dimensions, it has more than 5 times, 10 times or 100 times the extension compared to its third dimension. In other words, the thickness of the plate-shaped micromechanical functional element 110 is significantly lower than its natural extension. The plate-shaped micromechanical functional element 110 can, for example, be round, and the inner frame 120 can form a circular ring around the plate-shaped micromechanical functional element 110.

The holding elements 132 and the connecting pieces 122 (that can generally also be referred to as connecting elements) can be on a straight line, as shown in FIGS. 1a and 1b by sectional lines A-A, or can be offset to each other. By an offset arrangement of the holding elements 132 to the connecting pieces 122, a further reduction of the deviation of the deformation profile of the main face 212 of the plate-shaped micromechanical functional element 110 from the ideal deformation profile can be enabled, since the plate-shaped micromechanical functional element 110 is even more decoupled from the outer frame 130.

Between the plate-shaped micromechanical functional element 110 and the inner frame 120, the plate-shaped micromechanical functional element 110 and the inner frame 120 are separated from each other by open trenches (or edged trenches) at locations where no connecting pieces 122 are arranged. By arranging the open trenches, the plate-shaped micromechanical functional element 110 and the inner frame 120 are only mechanically coupled to each other by the connecting pieces 122. The open trenches define a distance between the plate-shaped micromechanical functional element 110 and the inner frame 120, which, however, does not have to be very large. For example, it can already be sufficient to make the open trenches at least as wide as half the thickness, the thickness, twice the thickness or 5 times the thickness of the plate-shaped micromechanical functional element 110. However, the open trenches can even be wider. The width of the open trench defines the distance of the plate-shaped micromechanical functional element 110 from the inner frame 120.

The plate-shaped micromechanical functional element 110, the inner frame 120 and the outer frame 130 can have a common monolithic layer or/and a common layer stack. The monolithic layer can, for example, be a silicon layer structured in an etching method, for shaping the plate-shaped micromechanical functional element 110, the inner frame 120 and the outer frame 130. Then, further layers can be deposited on the common monolithic layer for the different elements, for example, for enabling a variable curvature of the main face 212 of the plate-shaped micromechanical functional element 110. In other words, the common monolithic layer can be structured by open trenches for determining a shape of the plate-shaped micromechanical functional element 110, the inner frame 120 and the outer frame 130.

The holding elements 132 can be implemented to movably connect the inner frame 120 to the outer frame 130. Therefore, the holding elements 132 can, for example, be clamp-like spring elements or meander-shaped elements.

It is sufficient to connect the outer frame 130 to the inner frame 120 with only two holding elements 132, however, the stability of the micromechanical element 100, 150 can be improved when more than two holding elements 132, e.g. four or more holding elements 132 are used (as shown in FIGS. 1a and 1b).

The micromechanical element 100, 150, can be used, for example, in optical systems. Therefore, for example, the main face 212 of the plate-shaped micromechanical functional element 110 forms a reflecting surface (reflects, e.g., more than 70%, 90% or 99% of the incident light in the considered wave length range) of the plate-shaped micromechanical functional element 110. The reflection characteristics of the surface can be adapted to the respective application (e.g. to the wavelength of the used light). The plate-shaped micromechanical functional element can then also be referred to as mirror plate and in this context, the micromechanical element is also called micromirror. Some of the following embodiments relate to a micromirror having a mirror plate. The embodiments in the context of micromirrors and/or mirror plates with respect to shape and structure of the micromechanical element can, however, also be used independent of the application of the micromechanical element, generally for inventive micromechanical elements.

The outer frame 130, also referred to as fixed frame is, for example, part of that part of the micromechanical element, which is firmly connected to a housing of the micromechanical element or to a device where the micromechanical element is used.

Figure 3:
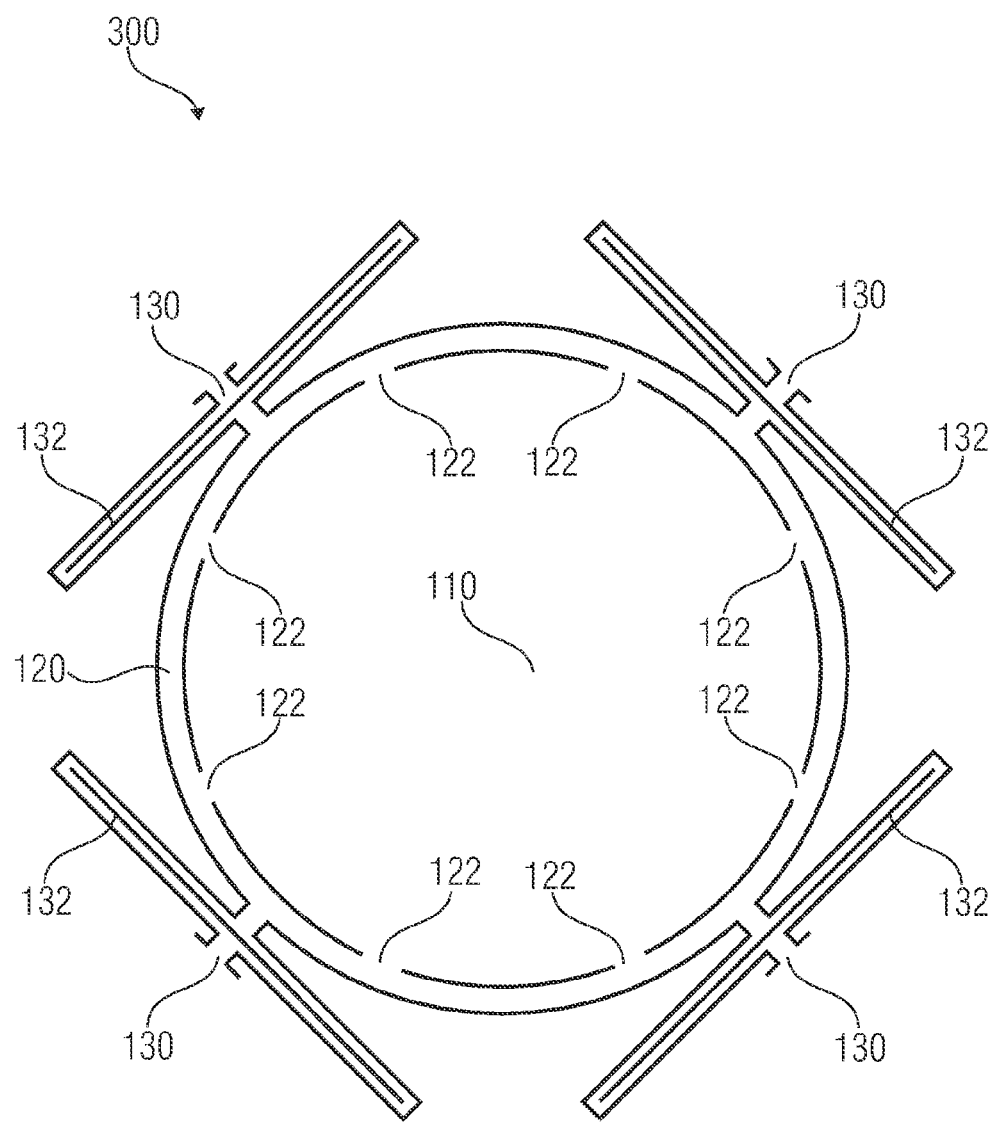
FIG. 3 is a schematic illustration of a top view of a micromechanical element having an inner frame.

FIG. 3 shows a schematical illustration of a top view of a micromechanical element 300 corresponding to an embodiment according to the invention. The micromechanical element 300 is based on the concept described above by means of FIGS. 1a, 1b, 2a and 2b. The open trenches between the inner frame 120 and the plate-shaped micromechanical functional element 110, below also referred to as mirror plate, are illustrated as black lines, since their width is small compared to the extension of the whole micromechanical element 300.

In order to distribute the mechanical restoring forces of the spring elements evenly across the periphery of the edge of the mirror plate 110, the frame structure 120 shown in FIG. 3 can be used. Here, the circular mirror plate 110 is connected to an annular frame structure 120 via connecting pieces 122. The annular frame structure 110 is again attached to the spring elements 132. The optimum number and position of the connecting pieces 122 can be determined with the help of geometrical optimizations.

The micromechanical element 300 shown in FIG. 3 can, for example, allow the realization of a micromirror for active focus variation, where a circular mirror plate 110 (plate-shaped micromechanical functional element) is connected to the spring elements 132 (holding elements) via a simple frame structure 120 (inner frame).

With the frame structure 120 and the connecting pieces 122 shown in FIG. 3, the location of the restoring force can be determined. The amount of the restoring force depends on the location of the connecting pieces 122, the width (extension orthogonal to the edge of the plate-shaped micromechanical function of element) of the annular frame structure 120 and the rigidity of the spring elements 132. Depending on the rigidity of spring elements 132 or depending on the lateral size of the mirror plate (or the amount of the force of the mirror plate) the simple frame structure 120, with optimum arrangement of the connecting pieces 122, cannot reduce the deviation of the deformation profile to the ideal deformation profile to zero or almost zero.

In the example shown in FIG. 3, the holding elements 132 are implemented as spring elements. This is obtained mainly by the meander-like structure of holding elements 132. Thereby, the restoring force of the holding elements 132 can be reduced, however, in this way, resistance against vibrations (shock resistance) is also reduced.

Figure 4:
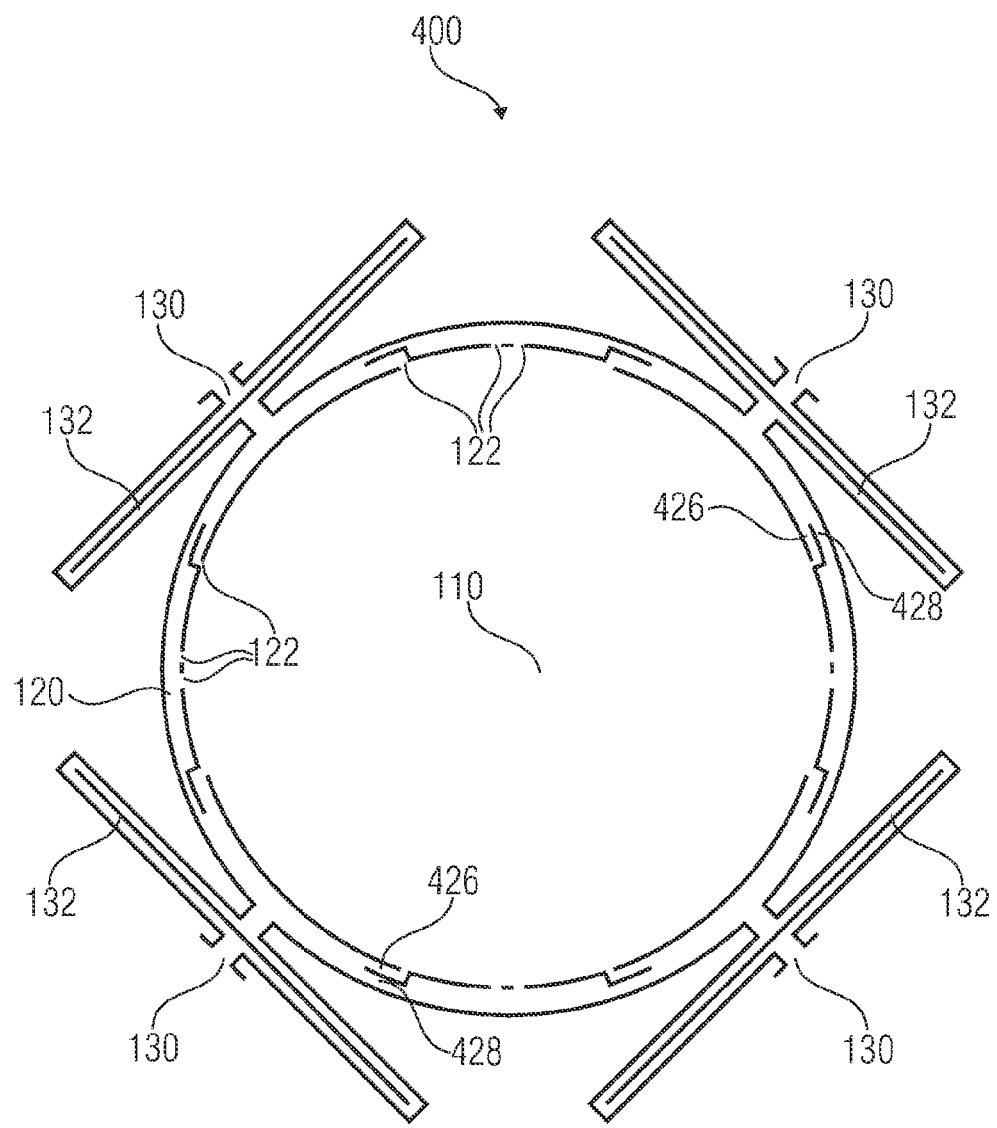
FIG. 4 is a schematic illustration of a top view of a micromechanical element having an inner frame and integrated distributed springs.

FIG. 4 shows a schematic illustration of a top view of a micromechanical element 400 corresponding to an embodiment according to the invention. The micromechanical element 400 is based on the principle illustrated in FIG. 3. However, part of the connecting pieces 122 of the plurality of connecting pieces is integrated as spring elements in the inner frame 110 between the plate-shaped micromechanical functional element 110 and the inner frame 120. Thereby, part of the spring elements 426 is formed by a part of the inner frame 120 running along an edge of the plate-shaped micromechanical functional element 110.

The connecting pieces implemented as spring elements 426 run, for example, at least partly in parallel to the edge of the plate-shaped micromechanical functional element 110, as shown in FIG. 4. Thereby, the inner frame 120 is partitioned into a first part 426 forming the spring element and the second part 428 in parallel to the edge of the plate-shaped micromechanical functional element 110. Thereby, for example, a width of the first part 426 is smaller than or of the same size as a width of the second part 428, wherein the width is measured, e.g., orthogonally to the edge of the plate-shaped micromechanical functional element 110.

By a micromechanical element 400 as shown in FIG. 4, for example, a micromirror for active focus variation can be realized, where a circular mirror plate 110 (plate-shaped micromechanical functional element) is connected to the spring elements 132 via a frame structure 120 (inner frame) with distributed springs 426.

FIG. 4 shows an embodiment, which can adjust, apart from the location, also the amount of the restoring force of the connecting pieces 122. Here, the annular frame structure 120 is slit at appropriate positions by an open trench. This results in two frame pieces 426 and 428 in sections of the frame structure 120. By selecting the length and width (length in parallel and width orthogonal to the edge of the plate-shaped micromechanical functional element) of these frame sections 426 and 428, the amount of the restoring force can be set independent of the position of the connecting pieces 122. With the help of geometric optimization (number and position of connecting pieces 122, number, position, length and width of the frame sections 426 and 428) it is possible to reduce the deviation of the deformation profile caused by the non-ideal soft springs to almost zero. The structure can also be referred to as "distributed springs".

The embodiments shown in FIGS. 1 to 4 can have several advantages for obtaining an almost ideal deformation profile of the main face of the plate-shaped micromechanical functional element 110. For example, with the help of the shown solutions (simple annular frame structure and frame structure having distributed springs) the deviation of the surface deformation from the ideal deformation profile resulting from the restoring forces of spring elements can be reduced to almost zero. More rigid spring elements can also be used, which has, again, a positive effect on the resistance against negative mechanical interference effects (shock resistance). The described concept can be implemented in a production process of such a micromirror without additional effort, since merely the contours (trenches/open trenches) that are necessitated anyway for the mirror plate have to be etched.

Figure 5A:
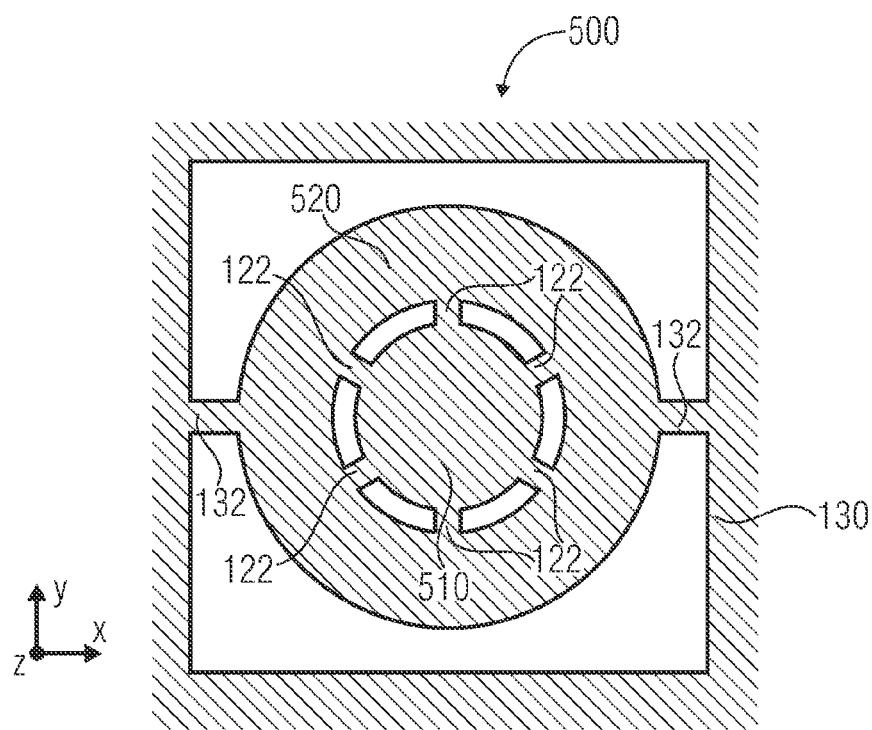
FIG. 5a, 5b is a schematic illustration of a top view of a micromechanical element.
Figure 5B:
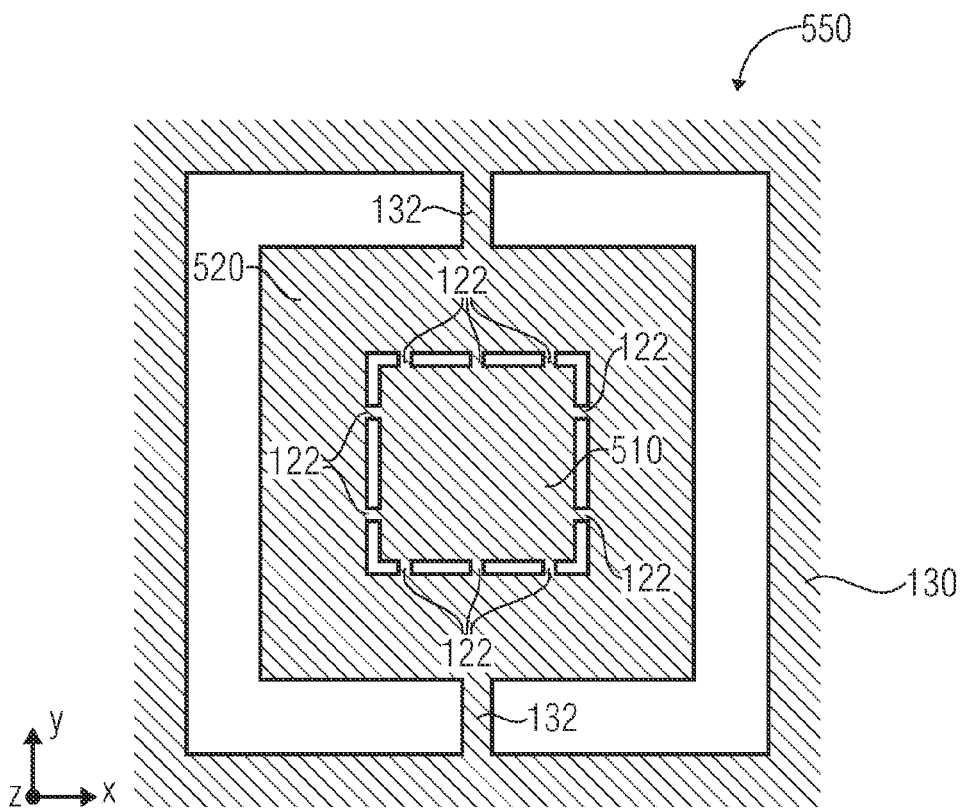

FIGS. 5a and 5b show a schematic illustration of a micromechanical element 500, 550 corresponding to an embodiment according to the invention. The micromechanical element 500, 550 comprises a plate-shaped micromechanical functional element having a first part 510 and a second part 520 and an outer frame 130. The second part 520 of the plate-shaped micromechanical functional element encloses the first part 510 of the plate-shaped micromechanical functional element along an edge of the first part 510 and is connected to the first part 510 via a plurality of connecting pieces 122. The first part 510 and the second part 520 form a main face of the plate-shaped micromechanical functional element. Thereby, a curvature of the main face of the plate-shaped micromechanical functional element is variable by varying a curvature of the first part 510 of the plate-shaped micromechanical functional element and a curvature of the second part 520 of the plate-shaped micromechanical functional element. The outer frame 130 is connected to the plate-shaped micromechanical functional element via at least two holding elements 132.

As discussed above, the fold-shaped deviation from the ideal deformation profile occurring due to non-linear distortions and at large deflections depends on the ratio of the bending to the plate thickness (w/t). The plate thickness cannot be enlarged arbitrarily due to the above-stated reasons.

Figure 6:
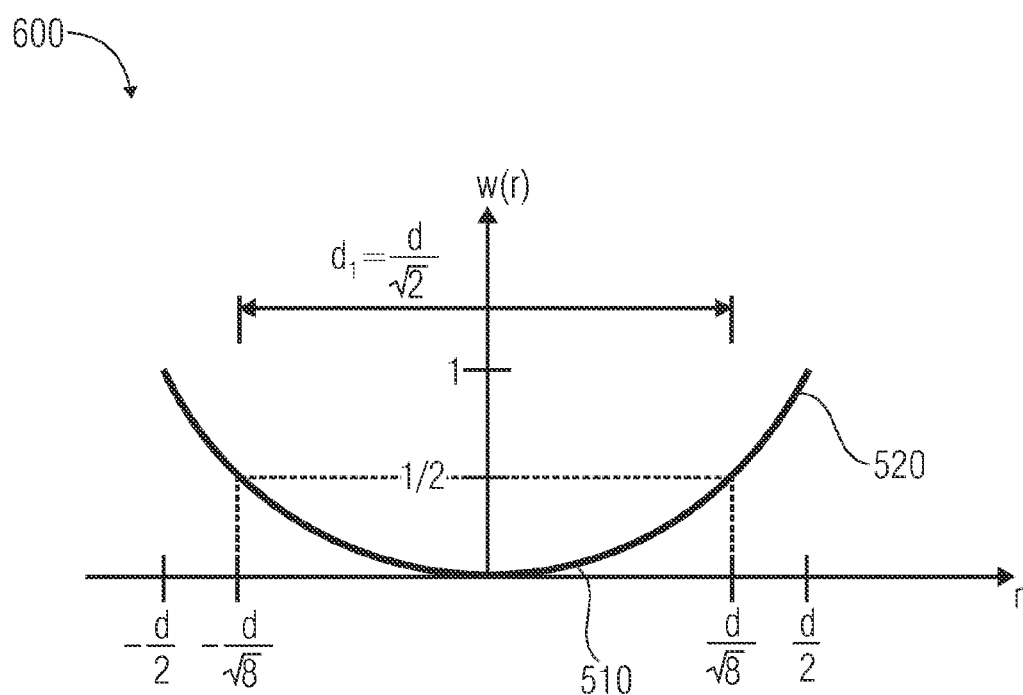
FIG. 6 is a normalized curve of the bending of an ideally spherically bent area in dependence on its radius.

For still being able to reduce the deviation, it is helpful to reduce the bending determining this effect, without reducing the entire bending necessitated for the target application. This can be solved by partitioning the mirror plate into several sections. In FIG. 6, this is illustrated by a curve shape 600 of the normalized bending w(r) in dependence on the radial distance r from the center of the mirror. The bending determining the above-described effect has been divided into half, by partitioning the entire mirror plate into an inner mirror plate 510 (first part of the plate-shaped micromechanical functional element) and an outer mirror plate 520 (second part of the plate-shaped micromechanical functional element). As far as both sections are connected to each other in a resilient manner, this results in an optimum ratio of the diameter of the inner mirror plate 510 to the diameter of the outer mirror plate 520 of $$\frac{d_1}{d} = \frac{1}{\sqrt{2}}$$

In other words, a normalized curve shape of the bending w of an ideal spherically bent mirror plate is shown in dependence on its radius r, wherein d is the entire diameter of the mirror plate and $d_1$ is the diameter of the inner mirror plate 510 (first part of the plate-shaped micromechanical functional element).

The optimum ratio of the diameter of the entire plate-shaped micromechanical functional element $d_1$ to the diameter of the first part 510 of the micromechanical plate-shaped functional element can vary, for example, in dependence on the configuration of the holding elements. An optimum ratio of diameters can, for example, also be found by simulation.

At locations where no connecting pieces 122 are arranged between the first part 510 and the second part 520, open trenches separate the first part 510 and the second part 520 from one another. The open trenches form a distance between the first part 510 and the second part 520. In order to reduce spurious diffractive effects at the trenches for light to be reflected, the distance can be adapted to the wavelength of the light to be reflected. For example, the distance can be selected larger than a wavelength of light for which the main face of the plate-shaped micromechanical functional element has reflecting characteristics.

The first part 510 and the second part 520 can be implemented to reduce a deviation of a deformation profile of the main face of the plate-shaped micromechanical functional element from an ideal deformation profile of the main face.

For example, the first part 510 of the plate-shaped micromechanical functional element can be circular and the second part 520 can form a round ring around the first part 510. Thereby, for example, a diameter of the first part 510 can have a ratio of 1 to $\sqrt{2}$ to an outer diameter of the second part 520 with a tolerance of 20% (or 0.1%, 1%, 5%, 10%, or 50%) of the diameter of the first part 510.

The plate-shaped micromechanical functional element can also have more than two parts. For example, the plate-shaped micromechanical functional element has a third part, wherein the third part encloses the second part 520 of the plate-shaped micromechanical functional element along an edge of the second part 520 and is connected to the second part 520 via a plurality of connecting pieces. Then, the third part forms together with the first part 510 and the second part 520 the main face of the plate-shaped micromechanical functional element. Further, the curvature of the main face of the micromechanical functional element is variable by varying a curvature of the first part 510 of the plate-shaped micromechanical functional element, a curvature of the second part 520 of the plate-shaped micromechanical functional element and a curvature of the third part of the plate-shaped micromechanical functional element.

Thereby, the third part can, for example, form a round ring around the second part 520. For reducing a deviation of the deformation profile of the main face from an ideal surface profile, for example, the outer diameter of the second part 520 can have a ratio of $\sqrt{2}$ to $\sqrt{3}$ to an outer diameter of the third part with a tolerance of 20% (or 0.1%, 1%, 5%, 10% or 50%) of the outer diameter of the second part 520, as well as the diameter of the first part 510 can have a ratio of 1 to $\sqrt{3}$ to an outer diameter of the third part with a tolerance of 20% (or 0.1%, 1%, 5%, 10% or 50%).

Further possible implementation options, e.g. with respect to shape and structure of the plate-shaped micromechanical functional element, the arrangement and number of holding elements 132 as well as connecting pieces 122 (or also called connecting elements) or other additional or optional features for the micromechanical elements 500, 550 as shown in FIGS. 5a and 5b can be taken accordingly from the description for the embodiments shown in FIGS. 1-4.

Several embodiments relate to a micromechanical element having an inner frame as shown and described, for example, in FIGS. 1-4, and a plate-shaped micromechanical functional element having a first part and a second part as shown in FIGS. 5a and 5b.

Figure 7:
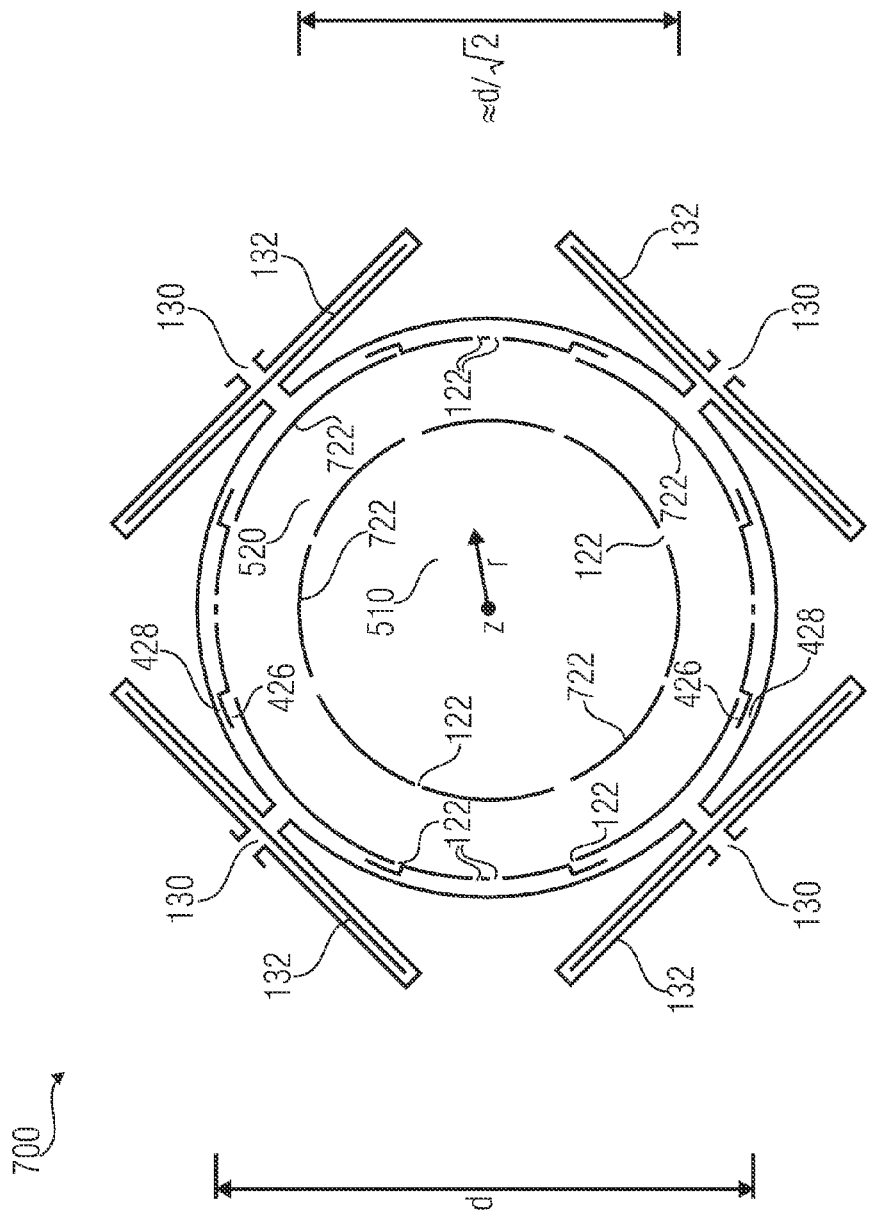
FIG. 7 is a schematic illustration of a top view of a micromechanical element having a partitioned plate-shaped micromechanical functional element and an inner frame with integrated distributed springs.

FIG. 7 shows a schematic illustration of a top view of a micromechanical element 700 corresponding to an embodiment. The micromechanical element 700 represents, for example, a combination of the concept illustrated and described in FIGS. 1-4 and the concept described in FIG. 5.

The outer frame is then connected to the plate-shaped micromechanical functional element via holding elements, inner frame and connecting pieces.

With the help of a described approach, the inventive embodiment 700 shown in FIG. 7 can successfully reduce the deviation from the ideal deformation profile resulting from the non-linear stress of the overall plate (plate-shaped micromechanical functional element). Separating the entire mirror plate into two partial plates 510, 520 has been realized by open trenches 722. Both partial plates are connected to one another by several connecting pieces 122. The number and position of these connecting pieces 122 can again be determined with the help of geometrical optimizations.

By the embodiment shown in FIG. 7, for example, a micromirror for active focus variation can be realized, with which a circular mirror plate is partitioned by a circular open trench 722 (with interruption by the connecting pieces 122) and two mirror plates 510 and 520 (first and second part of the plate-shaped micromechanical functional element).

Figure 8:
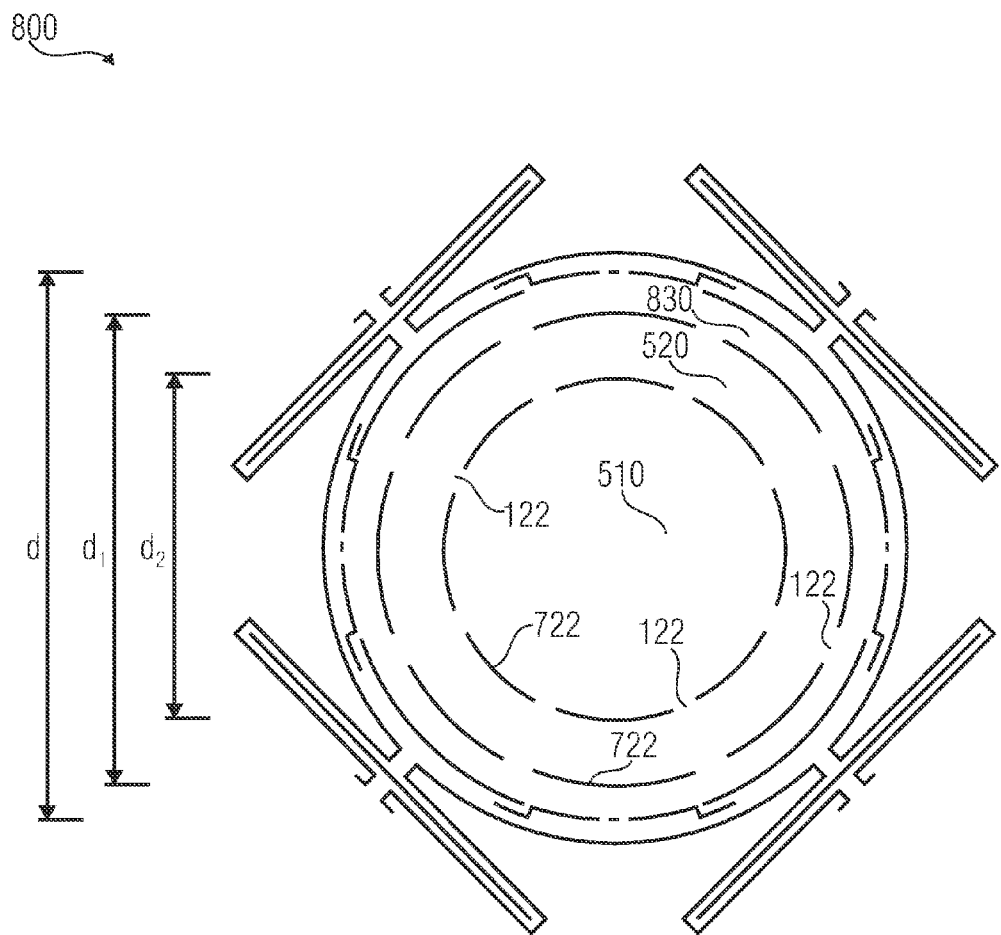
FIG. 8 is a schematic illustration of a top view of a micromechanical element having a partitioned plate-shaped micromechanical functional element and an inner frame with integrated distributed springs.
Figure 11:
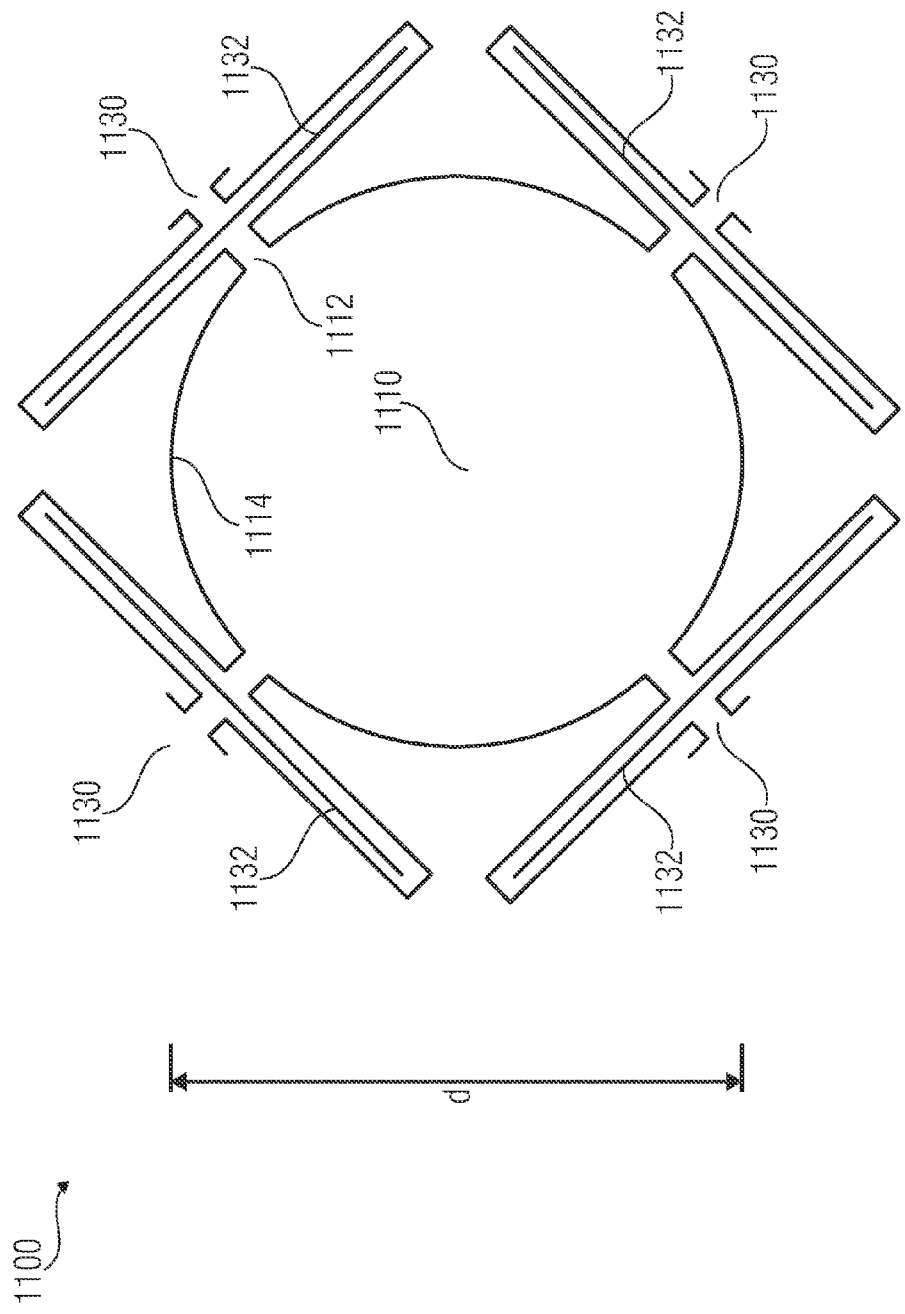
FIG. 11 is a schematic top view of a known circular mirror plate connected to a fixed frame via four spring elements.

As already described above, a further reduction of the deviation of the surface profile can be enabled by partitioning into several mirror plates. This is shown exemplarily in the inventive embodiment 800 in FIG. 8. Here, the mirror plate has been partitioned into three partial plates 510, 520 and 830 with the help of open trenches 722. The sections of the mirror plate are again connected to one another by connecting pieces 122.

Theoretically, the optimum diameters of the partial plates should be as follows:

$$\frac{d_1}{d} = \sqrt{\frac{2}{3}} \text{ and}$$

$$\frac{d_2}{d} = \sqrt{\frac{1}{3}}$$

Since the partial plates are, however, non-ideally resiliently connected to one another via connecting pieces 110 and hence influence each other, the ratios $d_1/d$ and $d_2/d$ found by geometrical optimization deviate therefrom. The size of the partial plates and the amount and position of connecting pieces can again be found out by geometrical optimization.

The micromechanical element 800 enables also, for example, a realization of a micromirror for active focus variation, where a circular mirror plate is partitioned into three mirror plates 510, 520 and 830 by two circular open trenches 722 (interrupted by connecting pieces 122).

By inserting open trenches (gaps) into the optically actively used area of the device (mirror plate), diffractive effects of the reflecting light can result. Depending on the target application, the diffractive effects can be minimized in that the trenches are implemented to be significantly wider than the wavelength of the incident light.

The embodiments shown in FIGS. 5-8 can have several advantages.

For example, minimization of the deviation from the ideal deformation profile by partitioning into partial mirror plates can be enabled independently of the actively adjustable mirror curvature and hence for all actively adjustable focus lengths of the micromirror (the ratios $d/d_1$ and $d/d_2$ ... is no function of the bending w). Further, the deviation from the ideal deformation profile at large deflections of the focusing mirror can also be reduced when the bending is higher than the entire plate thickness. Accordingly, thin plates that can be bent with lower actively coupled extensions can be also used. In the case of a thermomechanical driving principle, but also when using magnetoactive materials, a reduction of power consumption indicates the usage of electroactive materials, this can result in a reduction of the electric driving voltage of the device. Further, the solution can be realized during the production of the device without additional effort.

The inventive concept generally relates to a plate-shaped micromechanical functional element having a main face with variable curvature in embodiments. The statements made above apply independently of the driving principle used (for varying the curvature) and the exact vertical layer structure (number of layers, thickness of layers, materials, ... ), as long as the mirror plate (or generally the plate-shaped micromechanical functional element) can be bent, e.g. by an actively adjustable lateral expansion within any layer. Hence, generally, this can be referred to as a plate-shaped micromechanical functional element having variable curvature or, with regard to mirror plates, actively bendable mirror plates.

If the plate-shaped micromechanical functional element is implemented as a mirror plate, the mirror plate can have a mirrored layer suitable for the target application. This can but does not have to be a mechanically active material (e.g. a metallic electrode) of a monomorph or a bimorph.

In several embodiments, the micromechanical element comprises a curvature control apparatus. The curvature control apparatus can control a variation of the curvature of the plate-shaped micromechanical functional element based on a controllable excitation. The controllable excitation can, for example, be an electric, thermal or magnetic excitation.

In order to allow the actively variable curvature of the main face, the plate-shaped micromechanical functional element can comprise, for example, at least one layer having an extension laterally variable with respect to the main face, in order to vary a curvature of the main face of the plate-shaped micromechanical functional element based on the controllable excitation. The layer with variable extension can, for example, be a piezoelectric layer, an electrostrictive layer, a thermomechanical layer, a piezomagnetic layer or a magnetostrictive layer.

Therefore, the plate-shaped micromechanical functional element can comprise, e.g. a plurality of layers in parallel to the main face of the plate-shaped micromechanical functional element. Thereby, at least two layers have different materials (e.g. a carrier layer and a layer having a variable extension or an electrode and a layer having a variable extension).

The plate-shaped micromechanical functional element can have, for example, five layers in parallel to the plate-shaped micromechanical functional element. The five layers are composed of three electrode layers and two piezoelectric layers in alternating order. By applying a voltage to the electrode layers, the piezoelectric layers vary their lateral extension based on the piezoelectric effect and cause a variation of the curvature of the main face of the plate-shaped micromechanical functional element.

By this, for example, a vertically symmetrically structured piezoelectric bimorph having at least these five layers can be realized.

In a bent state, the main face of the plate-shaped micromechanical functional element can have a parabolic or spherical deformation profile. This relates to a parabolic or spherical deformation profile insofar as the same can be obtained within the remaining deviations from the ideal parabolic or spherical deformation profile.

The curvature of the main face of the plate-shaped micromechanical functional element can be bendable in a static, quasi-static or resonant manner. By a resonant curvature, usually, a larger maximum curvature can be obtained than in the quasi-static or stationary state, however, this maximum curvature is only obtained for a short time.

Several embodiments relate to a bendable micromirror for active focus variation and a reduction of the error of the surface information profile of a micromirror for active focus variation. Focus variation is thereby obtained by varying the curvature of a mirror plate (or generally a plate-shaped micromechanical functional element).

Such micromirrors can generally be used, for example, to focus laser beams, such as for adjusting the depth of field in material processing (cutting, marking, ... ) or for tracking the focus length in barcode lasers or in laser-based object measuring. In the same way, such micromirrors can be used for focus and zoom applications in imaging and image capturing systems, such as in projectors, in photo cameras, confocal microscopes, or in optical coherence tomography (OCT). Further, such micromirrors can be used when reading out multi-layered optical data carriers (e.g. multi-layer DVDs).

Several embodiments relate to a micromechanically produced and actively bendable mirror plate 110 connected to the fixed frame 130 (outer frame) of the device (micromechanical element) via a circular ring 120 (inner frame) or with the help of distributed springs 426, 428 via connecting pieces 122 and spring elements 132.

Alternative embodiments relate to micromechanically produced and actively bendable mirror plate 110 divided into at least two partial plate pieces 510, 520, 830 by one or several open trenches 722 and connected to one another via several connecting pieces 122.

The two above stated alternatives can also be combined with one another.

The mirror plate can comprise at least two material layers. Further, the mirror plate can have a circular, elliptical or square shape or can be implemented in a polygon-like free form. Further, the mirror plate can be connected to a fixed frame 130 by clamp-like spring elements 132 or meander-shaped spring elements. Additionally, the mirror plate can be actively bent, for example by the thermomechanical, piezoelectric, electrostrictive, piezomagnetic or magnetostrictive effect within at least one solid layer.

Further, the mirror plate can be bent such that the same collects the reflected light in a focal point. In other words, the mirror plate can be implemented to be bent such that the incident light is reflected and focused in a focal point. Therefore, the mirror plate can, for example, be bent such that the curvature of the middle plate has a parabolic or spherical deformation profile.

Further, the mirror plate can be bent, for example, in a quasi-static or resonantly active manner.

The inventive concept can be used, for example, to specifically correct a beam profile (of an incident light beam) and/or to deform (influence) the same arbitrarily.

The inventive concept can further be used, for example, to focus laser beams when cutting, marking and/or welding materials, to track the focus length in laser-based barcode scanners, for zoom and focus applications in imaging and image capturing systems, such as projectors, photo cameras, confocal microscopes and in optical coherence tomography, or for reading out multi-layered optical data carriers.

Several embodiments relate to a method for producing a micromechanical element according to the above-described concept. The method comprises etching of open trenches in order to determine the shape of the micromechanical element. By the open trenches, the shape of the plate-shaped micromechanical functional element, the shape of the outer frame, the shape of the inner frame as well as the shape of the first part and/or the shape of the second part of the plate-shaped micromechanical functional element can be defined.

In several embodiments, the plate-shaped micromechanical functional element of the micromechanical element comprises a first part and a second part, wherein the second part encloses the first part along an edge of the first part and is connected to the first part via a plurality of connecting pieces. Thereby, the first part and the second part form the main face of the plate-shaped micromechanical functional element. A curvature of the main face of the plate-shaped micromechanical functional element is variable by actively varying a curvature of the first part of the plate-shaped micromechanical functional element and by actively varying a curvature of the second part of the plate-shaped micromechanical functional element.

For this, both the first part and the second part of the plate-shaped micromechanical functional element have a structure enabling an active variation of the curvature. The statements made above apply independently of the driving principle used (for varying the curvature) and the exact vertical layer structure (number of layers, layer thicknesses, materials, . . . ). For example, the first and the second part can be bent by an actively adjustable lateral expansion within the layer of the first and second parts.

By actively bending the two parts of the plate-shaped micromechanical functional element, for example, a deformation profile as shown in FIG. 6 with only minor deviations can be generated.

In several embodiments, the plate-shaped micromechanical functional element comprises a monolithic layer or a layer stack structured by open trenches for determining a shape of the plate-shaped micromechanical functional element, a shape of the inner frame and a shape of the outer frame.

In several embodiments, the plate-shaped micromechanical functional element is round and the inner frame forms a circular ring around the plate-shaped micromechanical functional element.

Generally, the plate-shaped micromechanical functional element can have a round, oval, square, rectangular or polygonal shape or a polygon-like free form.

In several embodiments, the plate-shaped micromechanical functional element comprises a plurality of layers in parallel to the main face of the plate-shaped micromechanical functional element, wherein at least two layers comprise different materials.

The plate-shaped micromechanical functional element comprises, for example, five layers in parallel to the main face of the plate-shaped micromechanical functional element, wherein a second electrode layer is arranged between a first electrode layer and a third electrode layer, a first piezoelectric layer is arranged between the first electrode layer and the second electrode layer, and a second piezoelectric layer is arranged between the second electrode layer and the third electrode layer.

According to one aspect, the main face of the plate-shaped micromechanical functional element forms a reflective surface of the plate-shaped micromechanical functional element.

Thereby, for example, the curvature of the main face is variable, such that light reflected from the main face is focused in a focal point.

According to another aspect, the curvature of the main face is alterable (or bendable) in a static, quasi-static or resonant manner.

In several embodiments, the holding elements are implemented as spring elements.

In several embodiments, the micromechanical element is implemented to specifically correct a beam profile, or to deform the same arbitrarily, to focus laser beams when cutting, marking or welding materials, to track a focus length in barcode scanners, and to perform zoom and focus applications in imaging and image capturing systems or to read out multi-layered optical data carriers.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:
1. Micromechanical element comprising:
 a plate-shaped micromechanical functional element, wherein a curvature of a main face of the plate-shaped micromechanical functional element is variable,
 an inner frame that encloses the plate-shaped micromechanical functional element along an edge of the main face of the plate-shaped micromechanical functional element and that is connected to the plate-shaped micromechanical functional element via a plurality of connecting pieces; and an outer frame connected to the inner frame via at least two holding elements, wherein the inner frame is connected to the plate-shaped micromechanical functional element and the outer frame such that an amount of a first angle between the main face of the plate-shaped micromechanical functional element at the edge of the plate-shaped micromechanical functional element and a main face of the inner frame at an edge of the inner frame facing the plate-shaped micromechanical functional element is smaller than an amount of a second angle between a main face of the outer frame and the main face of the inner frame at an edge of the inner frame facing the outer frame, when the main face of the plate-shaped micromechanical functional element is in a curved state.

2. Micromechanical element according to claim 1, wherein open trenches separate the plate-shaped micromechanical functional element and the inner frame at positions between the plate-shaped micromechanical functional element and the inner frame where no connecting pieces are arranged.

3. Micromechanical element according to claim 1, wherein the plate-shaped micromechanical functional element, the inner frame and the outer frame comprise a common monolithic layer or a common layer stack.

4. Micromechanical element according to claim 1, wherein the holding elements are implemented to connect the inner frame in a movable manner with respect to the outer frame.

5. Micromechanical element according to claim 1, wherein at least one connecting piece of the plurality of connecting pieces is integrated into the inner frame between the plate-shaped micromechanical functional element and the inner frame as spring element, wherein a part of the spring element is formed by a part of the inner frame running along the edge of the plate-shaped micromechanical functional element.

6. Micromechanical element according to claim 1, wherein the inner frame is implemented to reduce a deviation of a deformation profile of the main face of the plate-shaped micromechanical functional element from an ideal deformation profile of the main face.

7. Micromechanical element according to claim 1, wherein the plate-shaped micromechanical functional element comprises a first part and a second part, wherein the second part encloses the first part along an edge of the first part and is connected to the first part via a plurality of connecting pieces, wherein the first part and the second part form the main face of the plate-shaped micromechanical functional element, and wherein a curvature of the main face of the plate-shaped micromechanical functional element is variable by varying a curvature of the first part of the plate-shaped micromechanical functional element and a curvature of the second part of the plate-shaped micromechanical functional element.

8. Micromechanical element according to claim 1, comprising a curvature control apparatus implemented to control a variation of the curvature of the plate-shaped micromechanical functional element based on a controllable excitation.

9. Micromechanical element according to claim 8, wherein the controllable excitation is an electric, thermal or magnetic excitation.

10. Micromechanical element according to claim 8, wherein the plate-shaped micromechanical functional element comprises at least one layer with a laterally variable extension with respect to the functional main face, which is implemented to vary a curvature of the functional main face of the plate-shaped micromechanical functional element based on the controllable excitation.

11. Micromechanical element according to claim 8, wherein the layer with a variable extension is a piezoelectric layer, an electrostrictive layer, a thermomechanical layer, a piezomagnetic layer or a magnetostrictive layer.

12. Micromechanical element according to claim 1, wherein the functional main face is bendable, such that the functional main face shows a parabolic or spherical deformation profile.

13. Micromechanical element according to claim 1, wherein the holding elements are clamp-like spring elements or meander-shaped elements.

14. Micromechanical element according to claim 1, wherein a number of connecting pieces is higher than a number of holding elements.

15. Micromechanical element according to claim 1, wherein the main face of the plate-shaped micromechanical functional element forms a reflective surface of the plate-shaped micromechanical functional element.

16. Method for producing a micromechanical element according to claim 1, comprising:
    etching open trenches to determine a shape of the micromechanical element.

17. Micromechanical element according to claim 1, wherein the inner frame is formed between the plate-shaped micromechanical functional element and the outer frame.

18. Micromechanical element comprising:
    a plate-shaped micromechanical functional element with a first part and a second part, wherein the second part of the plate-shaped micromechanical functional element encloses the first part of the plate-shaped micromechanical functional element along an edge of the first part and is connected to the first part via a plurality of connecting pieces, wherein the first part and the second part form a functional main face of the plate-shaped micromechanical functional element, and wherein a curvature of the functional main face of the plate-shaped micromechanical functional element is variable by varying a curvature of the first part of the plate-shaped micromechanical functional element and a curvature of the second part of the plate-shaped micromechanical functional element; and
    an outer frame connected to the plate-shaped micromechanical functional element via at least two holding elements.

19. Micromechanical element according to claim 18, wherein the first part and the second part of the plate-shaped micromechanical functional element are implemented to reduce a deviation of the deformation profile of the functional main face of the plate-shaped micromechanical functional element from an ideal deformation profile of the functional main face.

20. Micromechanical element according to claim 18, wherein the first part of the plate-shaped micromechanical functional element is circular and the second part forms a round ring around the first part.

21. Micromechanical element according to claim 20, wherein a diameter of the first part comprises a ratio of 1 to $\sqrt{2}$ to an outer diameter of the second part with a tolerance of 20% of the diameter of the first part.

22. Micromechanical element according to claim 18, wherein the plate-shaped micromechanical functional element comprises a third part, wherein the third part encloses the second part of the plate-shaped micromechanical functional element along an edge of the second part and is connected to the second part via a plurality of connecting pieces, wherein the third part forms the functional main face of the plate-shaped micromechanical functional element together with the first part and the second part, and wherein the curvature of the functional main face of the plate-shaped micromechanical functional element is variable by varying a curvature of the first part of the plate-shaped micromechanical functional element, a curvature of the second part of the plate-shaped micromechanical functional element and a curvature of the third part of the plate-shaped micromechanical functional element.

23. Micromechanical element according to claim 22, wherein the third part forms a round ring around the second part.

24. Micromechanical element according to claim 23, wherein an outer diameter of the second part comprises a ratio of $\sqrt{2}$ to $\sqrt{3}$ to an outer diameter of the third part with a tolerance of 20% of the outer diameter of the second part, and wherein a diameter of the first part comprises a ratio of 1 to $\sqrt{3}$ to an outer diameter of the third part with a tolerance of 20% of the diameter of the first part.

25. Micromechanical element according to claim 18, wherein the curvature of the functional main face of the plate-shaped micromechanical functional element is variable by actively varying a curvature of the first part of the plate-shaped micromechanical functional element and by actively varying a curvature of the second part of the plate-shaped micromechanical functional element.

26. Micromechanical element according to claim 18, wherein open trenches separate the first part and the second part from one another at locations between the first part and the second part where no connecting pieces are arranged.

27. Micromechanical element according to claim 26, wherein the open trenches form a distance between the first part and the second part, wherein the distance is higher than a wavelength of light for which the functional main face of the plate-shaped micromechanical functional element comprises reflecting characteristics.

* * * * *

UNITED STATES PATENT AND TRADEMARK OFFICE
CERTIFICATE OF CORRECTION

| | |
|---|---|
| PATENT NO. | : 8,570,637 B2 |
| APPLICATION NO. | : 13/091571 |
| DATED | : October 29, 2013 |
| INVENTOR(S) | : Conrad et al. |

It is certified that error appears in the above-identified patent and that said Letters Patent is hereby corrected as shown below:

On the title page item (73), Assignee should read "Fraunhofer-Gesellschaft zur Foerderung der angewandten Forschung e. V."

Signed and Sealed this
Seventeenth Day of February, 2015

Michelle K. Lee
*Deputy Director of the United States Patent and Trademark Office*